United States Patent [19]

Nishiyama

[11] Patent Number: 4,775,020

[45] Date of Patent: Oct. 4, 1988

[54] ELECTRONIC APPLIANCE

[75] Inventor: Yoshihisa Nishiyama, Shizuoka, Japan

[73] Assignee: Tokyo Electric Co., Ltd., Tokyo, Japan

[21] Appl. No.: 98,227

[22] Filed: Sep. 18, 1987

[30] Foreign Application Priority Data

Sep. 26, 1986 [JP] Japan .................................. 61-227435

[51] Int. Cl.$^4$ ........................... G01G 3/14; G01G 3/08
[52] U.S. Cl. ...................................... 177/211; 177/229
[58] Field of Search ................................. 177/211, 229

[56] References Cited

U.S. PATENT DOCUMENTS 4,128,001 12/1978 Marks .............................. 177/229 X
4,660,667 4/1987 Uchimura et al. ............... 177/211 X Primary Examiner—George H. Miller, Jr.
Attorney, Agent, or Firm—Oblon, Fisher, Spivak, McClelland, & Maier

[57] ABSTRACT

The invention provides an electronic appliance wherein a detection output of a sensor means is not influenced by a high frequency component originating in external radio waves. The electronic appliance comprises a conductor member located in a spaced relationship by a predetermined distance from a base which constitutes a body case together with a housing. A by-pass route is provided for by-passing a sensor means near the conductor member to introduce a high frequency component of electric current flow induced in the conductor member to the base. A distributed capacitance forming means is interposed in the by-pass route. Thus, a high frequency component of electric current flow induced in the conductor member is released to the body case via the by-pass route.

26 Claims, 8 Drawing Sheets

ELECTRONIC APPLIANCE

FIELD OF THE INVENTION AND RELATED ART STATEMENT

This invention relates to an electronic appliance wherein input information is read by a sensor means, and more particularly to an electronic appliance of the type mentioned wherein the sensor means is covered by a conductor member.

As representative ones of such electronic appliances as mentioned above, a load cell weighing instrument and an optical disk player can be listed. These appliances have common features that a sensor means reads input information and outputs it as an electric signal and that the sensor means is located near a conductor member; in particular, in a load cell weighing instrument, a scale plate frame connected to a load cell is a conductor member while in an optical disk player, an information media is a conductor member.

Here, a conventional load cell weighing instrument as an electronic appliance is described with reference to FIGS. 16 and 17. The load cell weighing instrument shown includes a base 1 formed rigidly from a metal material, and a load cell 2 secured at a fixed portion at an end thereof to the base 1. The load cell 2 has at the opposite end thereof a movable portion 6 to which a scale plate frame 5 on which a scale plate 4 is placed is secured. Here, the one end and the other end of the load cell 2 denote opposite horizontal ends of the load cell 2, and the fixed portion 3 is secured at a lower face of the load cell 2 to the base 1 while the scale plate frame 5 is secured to the movable portion 6 at an upper face of the load cell 2. It is to be noted that the load cell 2 is made of a metal material such as stainless steel or aluminum while the scale plate frame 5 is made of, for example, iron, aluminum, brass or copper. The load cell 2 further has a pair of arms 8 formed between the fixed portion 3 and the movable portion 6 thereof. Each of the arms 8 of the load cell 2 has a pair of distortion yielding portions 7 as signal generating means formed thereon such that the distortion yielding portions 7 of the arms 8 may be located at four corners of a parallelogram. A strain gauge 9 as a sensor means is applied to a surface of each of the distortion yielding portions 7 of the load cell 2. The strain gauges 9 are connected to a dc power source 10 in such a manner that they may form a bridge circuit 11. The bridge circuit 11 is connected to a dc amplifier 13 as an amplifier located at a stage preceding to a detecting circuit 12.

Thus, if a load is applied to the scale plate 4, the distortion yielding portions 7 of the load cell 2 are deformed in accordance with a value of the load. Consequently, the resistance values of the strain gauges 9 are changed so that the bridge circuit 11 generates an electric output from which the load value is to be determined.

While a load value is determined depending upon such a detecting principle as described above, there is a problem that the dc amplifier 13 is readily influenced by external radio waves because it has a function to convert an electric power originating in such external radio waves into a dc current flow.

Meanwhile, in super markets and the like, portable radio equipments of the 400 MHz band are frequently used by guards for the object of internal guarding. If such a radio equipment is used near a load cell weighing instrument, a high frequency component may be induced in the scale plate frame 5 of the load cell weighing instrument by electromagnetic waves from the radio equipment. The high frequency component flows through the distortion yielding portions 7 of the arms 8 of the load cell 2 of the load cell weighing instrument and is transmitted via the strain gauges 9 to the dc amplifier 13. Since the dc amplifier 13 has a function to convert a high frequency component into a dc current flow, it also converts the high frequency component transmitted thereto into a dc current flow. However, the dc current flow originating in the high frequency component cannot be distinguished from a correct dc signal originating from the strain gauges 9, which will result in error in operation.

In order to eliminate such a drawback, a countermeasure as shown in FIG. 18 is conventionally taken. In particular, an insulator member 14 of a plastics material is interposed at a connecting location between the base 1 and the load cell 2 and also at a connecting location between the load cell 2 and the scale plate frame 5. The insulator members 14 prevent a high frequency component induced in the scale plate frame 5 by external radio waves from flowing to the distortion yielding portions 7 of the load cell 2.

Another example of conventional countermeasures is illustrated in FIG. 19 wherein a low-pass filter 15 is interposed between the bridge circuit 11 and the dc amplifier 13 in order to electrically remove such a high frequency component.

Problems of such prior art appliances will be described now. At first, the appliance which includes the insulator members 14 as shown in FIG. 18 has a problem that it lacks in mechanical strength. Besides, it is also a problem that a change in dimension will be caused by repetitive applications of mechanical stress as time passes.

On the other hand, the appliance which includes the low-pass filter 15 as shown in FIG. 19 has a drawback that its cost is high.

Further, a high frequency voltage produced between the scale plate frame 5 and the base 1 by a high frequency component induced in the scale plate frame 5 may possibly influence directly on the dc amplifier 13 without passing a route provided by the strain gauges 9. Accordingly, the exemplary countermeasures as shown in FIGS. 18 and 19 exhibit a problem that they cannot perfectly eliminate possible influence of a high frequency component on the dc amplifier 13.

It is to be noted that such problems of a load cell weighing instrument as described above are not peculiar to the load cell weighing instrument and similar problems exist, for example, in an optical disk player.

Objects and Summary of the Invention

It is a first object of the present invention to provide an electronic appliance wherein a high frequency component originating in electromagnetic waves can be removed by an inexpensive means.

It is a second object of the present invention to provide an electronic appliance wherein a high frequency component originating in electromagnetic waves can be removed while maintaining the mechanical strength of the electronic appliance.

It is a third object of the present invention to provide an electronic appliance which can assuredly intercept transmission to a dc amplifier of a high frequency component originating in electromagnetic waves.

In order to attain the objects, according to the present invention, an electronic appliance comprises a by-pass route for by-passing a sensor means near a conductor member located in a spaced relationship by a fixed distance from a base which forms a body case together with a housing to introduce a high frequency component of electric current flow induced in the conductor member by electromagnetic waves to the base, the by-pass route having a distributed capacitance forming means therein. With the construction, electric current flow induced in the conductor member is introduced via the by-pass route to the body case and does not pass the sensor means. Or even if it passes the sensor means, it is very little. Accordingly, no influence of a high frequency component originating, for example, in external radio waves is had on a detection output of the sensor means. Besides, no high frequency component is transmitted to an amplifier which amplifies an output signal of the sensor means.

DESCRIPTION OF THE PREFERRED EMBODIMENTS

Figure 1:
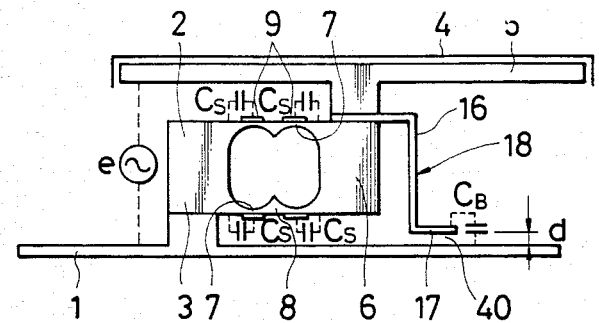
FIG. 1 is a front elevational view of a basic structure of a load cell weighing instrument showing a first embodiment of the present invention.
Figure 2:
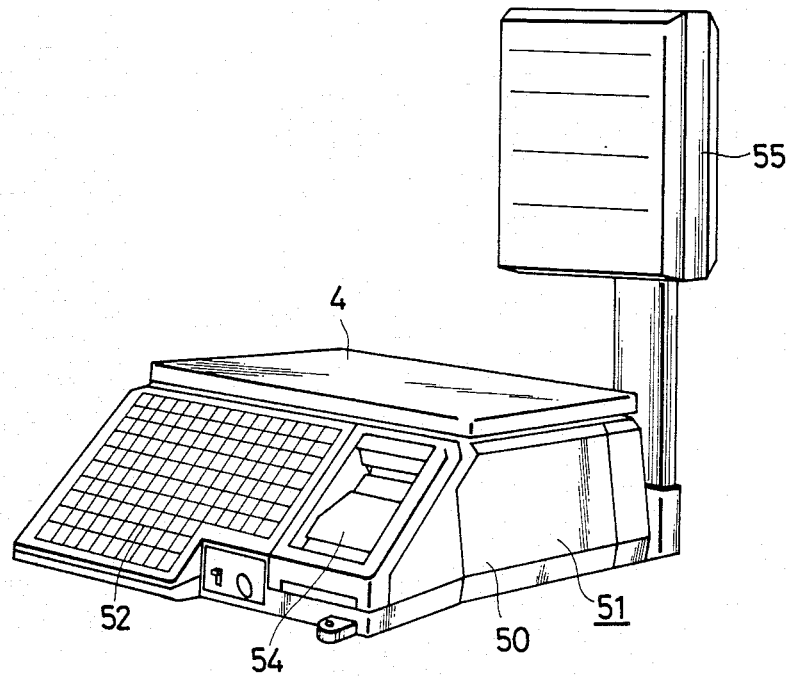
FIG. 2 is a perspective view of the entire load cell weighing instrument.
Figure 3:
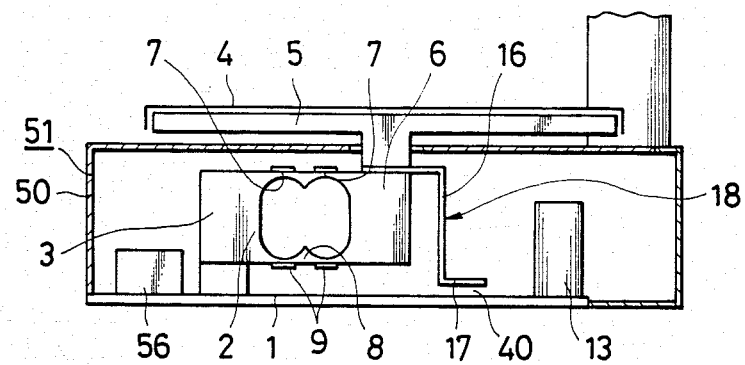
FIG. 3 is a vertical sectional front elevational view of the load cell weighing instrument of FIG. 2.

A first embodiment of the present invention will now be described with reference to FIGS. 1 to 5. In the present embodiment, the electronic appliance is in the form of a load cell weighing instrument. Thus, like parts or portions are denoted by like reference numerals to those of FIGS. 16 to 19 described above, and description thereof will be omitted to avoid redundancy (this also applies to all the following embodiments and modifications described below). The load cell weighing instrument shown includes a body case 51 including a base 1 and a housing 50 mounted on the base 1. A keyboard 52 is mounted at a front portion of the body case 51, and a paper discharging port 54 is formed in a front wall of the body case 51 for discharging therethrough paper from a printer 53 which is located within the body case 51. A scale plate 4 is placed on a scale plate frame 5 located above the body case 51, and a display device 55 is erected uprightly from a rear face of the body case 51. Located within the body case 51 are, in addition to the printer 53, a load cell 2, a controller 56 including a detecting circuit 12 connected to a bridge circuit 11 which are constituted from strain gauges 12 of the load cell 2, and a dc amplifier 13 connected between the controller 56 and the bridge circuit 11.

Meanwhile, in the present embodiment, a metal plate 16 is integrally coupled at an end thereof between the load cell 2 and the scale plate frame 5. The metal plate 16 is bent so as to extend first downwardly and then horizontally such that it may provide at the other end thereof an opposing wall 17 which is opposed in a spaced relationship by a distance d to the base 1. Thus, a distributed capacitance forming means 40 is formed by and between the base 1 and the opposing wall 17 of the metal plate 16, and a by-pass route 18 is formed by the distributed capacitance forming means 40 and the metal plate 16. Here, the distance d between the opposing wall 17 of the metal plate 16 and the base 1 is set within a range from 0.5 mm to 2.0 mm.

Figure 4:
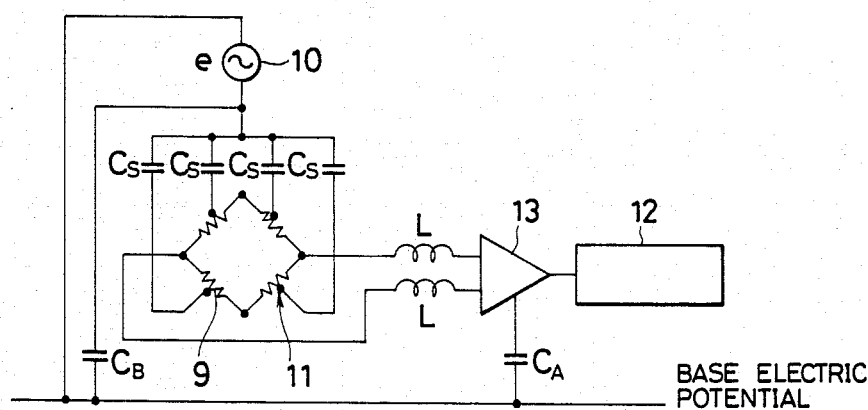
FIG. 4 is a circuit diagram of an electric circuit of the load cell weighing instrument.
Figure 5:
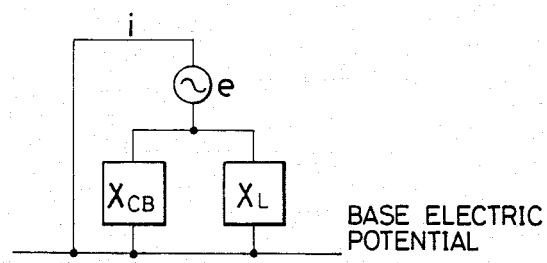
FIG. 5 is a schematic circuit diagram illustrating admittance of the electric circuit.

If the load cell weighing instrument of such a construction as described above is placed in an environment wherein it receives external radio waves coming thereto, a high frequency voltage e as a high frequency component will be produced between the scale plate frame 5 and the base 1. Meanwhile, as seen in FIG. 1, distributed capacitance $C_S$ exists between the scale plate frame 5 and each of the strain gauges 9; distributed capacitance $C_B$ exists between the opposing wall 17 of the metal plate 16 and the base 1, that is, at the distributed capacitance forming means 40; and distributed capacitance $C_A$ exists between the dc amplifier 13 and the base 1. Particularly, a value of the distributed capacitance $C_B$ is calculated from an equation $$C_B = \epsilon_0 \epsilon_S \cdot s / d \ldots \quad (1)$$

where $\epsilon_0$ is the dielectric constant of the vacuum, $\epsilon_S$ a specific inductive capacity of the air, and s an opposing area of the base 1 to the opposing wall 17 of the metal plate 16. Thus, the distributed capacitance $C_B$ in the case of the arrangement of the embodiment were calculated in accordance with the equation (1) above: the resulted distributed capacitance $C_B$ is within 20 to 50 PF. Further, distributed inductance L exists in wirings from the strain gauges 9 to the dc amplifier 13. Here, if the reactance of the distributed capacitance $C_B$ for the high frequency voltage e is represented as $X_{CB}$ and the reactance provided by the distributed capacitance $C_S$, $C_A$ and the distributed inductance L as $X_L$, the circuit shown in FIG. 4 is represented as shown in FIG. 5.

Here, if $X_{CB} << X_L$, then the current i by the high frequency voltage e will flow to the reactance $X_{CB}$ side and accordingly the high frequency voltage is not applied to the dc amplifier 13. Consequently, operation in error is eliminated.

Besides, such elimination of operation in error can be attained only by provision of the metal plate 16 and does not involve any change in basic construction of the electronic appliance which has some influence on a performance of the load cell weighing instrument as a weighing instrument. Accordingly, no change is involved in structural strength or accuracy, and the load cell weighing instrument can be produced at a low cost.

Figure 6:
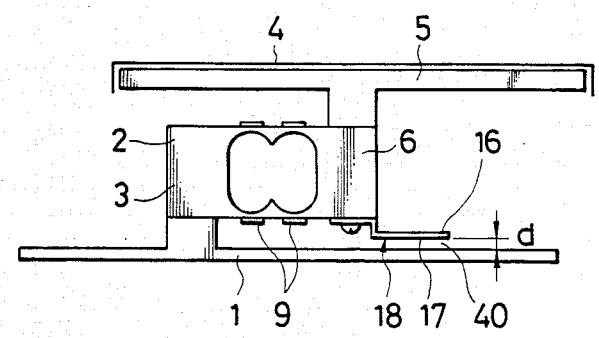
FIG. 6 is a front elevational view showing a modified form of the load cell weighing instrument.

FIG. 6 illustrates a modification to the embodiment shown in FIGS. 1 to 5. In the modification shown, a metal plate 16 is secured to a lower face of a movable portion 3 of a load cell 2.

Figure 7:
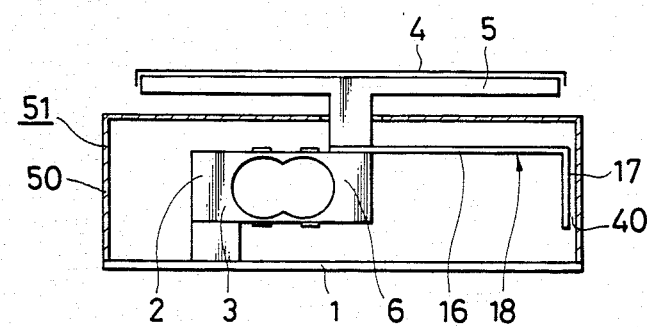
FIG. 7 is a vertical sectional front elevational view showing another modified form of the load cell weighing instrument.

Meanwhile, FIG. 7 illustrates another modification to the embodiment. In the modification, one end of a metal plate 16 which has the other end thereof secured between a load cell 2 and a scale plate frame 5 is opposed to an inside wall 50a of a housing 50 to form an opposing wall 17 in order to form a by-pass route 18. It is to be noted, however, that the metal plate 16 must not always be secured between the load cell 2 and the scale plate frame 5 but to some other member or location such as, for example, a lower face of the movable portion 6 of the load cell 2.

Figure 8:
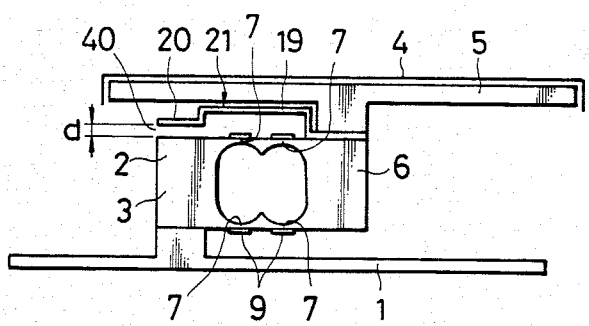
FIG. 8 is a front elevational view of a basic structure of a load cell weighing instrument showing a second embodiment of the present invention.

Now, a second embodiment of the present invention will be described with reference to FIG. 8. A metal plate 19 in the present embodiment has one end secured to a connecting location between a load cell 2 and a scale plate frame 5 and is bent into a profile wherein it does not interfere with distortion yielding portions 7 of the load cell 2. The metal plate 19 has an opposing wall 20 formed thereon and located in an opposing relationship to an upper face of a movable portion 3 of the load cell 2 with a gap of a distance d left therebetween. Thus, a distributed capacitance forming means 40 is formed by and between the movable portion 3 of the load cell 2 and the opposing wall 20 of the metal plate 19, and a by-pass route 21 is formed including the distributed capacitance forming means 40. It is to be noted that the profile of the metal plate 19 wherein it does not interfere with the distortion yielding portions 7 means such a profile of the metal plate 19 that it extends around the distortion yielding portions 7 of the load cell 2 in a suitably spaced relationship.

Figure 9:
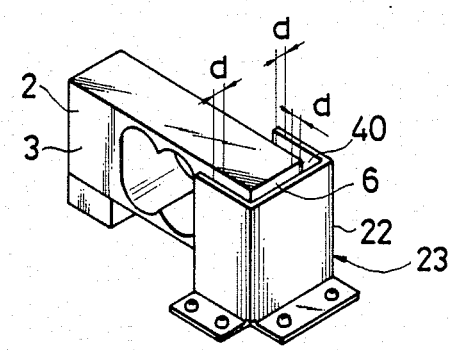
FIG. 9 is a perspective view of a basic structure of a load cell weighing instrument showing a third embodiment of the present invention.

FIG. 9 shows a third embodiment of the present invention. In a load cell weighing instrument shown, a by-pass route 23 is formed by a metal plate 22 which extends uprightly from a base 1 and is shaped and located so as to oppose to three outer faces of a movable portion 3 of a load cell 2 with a gap of a predetermined distance d left therebetween. Accordingly, a distributed capacitance forming means 40 is formed by and between the movable portion 3 of the load cell 2 and the metal plate 22 which oppose to each other with the gap of the predetermined distance d left therebetween. It is to be noted that when it is intended to determine the distributed capacitance $C_B$ in the present embodiment from the equation (1) above, s in the equation (1) must be a total area of those portions of the three outer faces of the metal plate 22 which oppose to the load cell 2 with the gap of the distance d left therebetween.

Figure 10:
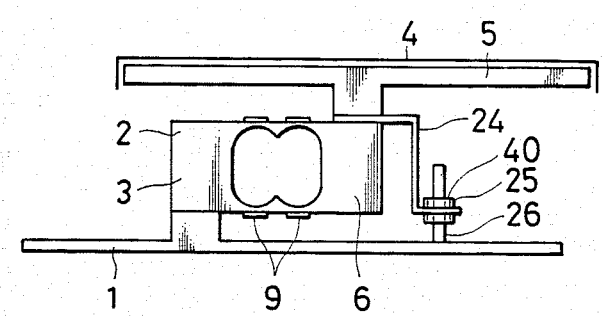
FIG. 10 is a front elevational view of a basic structure of a load cell weighing instrument showing a fourth embodiment of the present invention.

Referring now to FIG. 10, a fourth embodiment of the present invention is shown wherein a through type capacitor 25 is mounted on a metal plate 24 secured to a connecting location between a load cell 2 and a scale plate frame 5, and a metal bar 26 is erected uprightly on a base 1 and is loosely fitted in the capacitor 25 so as to allow movement of the capacitor 25 therealong, thereby forming a by-pass route 27. Accordingly, a distributed capacitance forming means 40 is formed by and between the through type capacitor 25 and the metal plate 26.

Figure 11:
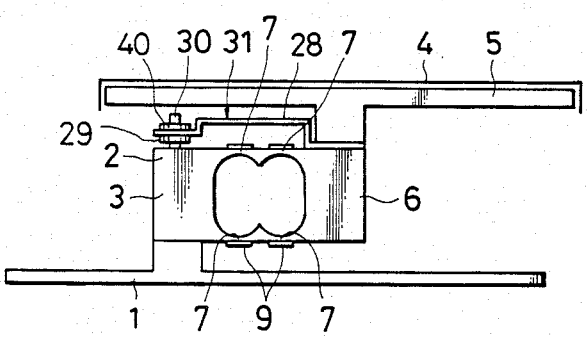
FIG. 11 is a front elevational view of a basic structure of a load cell weighing instrument showing a fifth embodiment of the present invention.

FIG. 11 shows a fifth embodiment of the present invention wherein a through type capacitor 29 is mounted at an end of a metal plate 28 which extends from a movable portion 6 toward a fixed portion of a load cell 2, and a metal bar 30 is erected uprightly on the fixed portion 3 of the load cell 2 and is loosely fitted in the capacitor 29 so as to allow movement of the capacitor 29 therealong, thereby forming a by-pass route 31. Naturally, an intermediate portion of the metal plate 28 is shaped such that it may extend in a suitably spaced relationship around distortion yielding portions 7 of the load cell 2.

Figure 12:
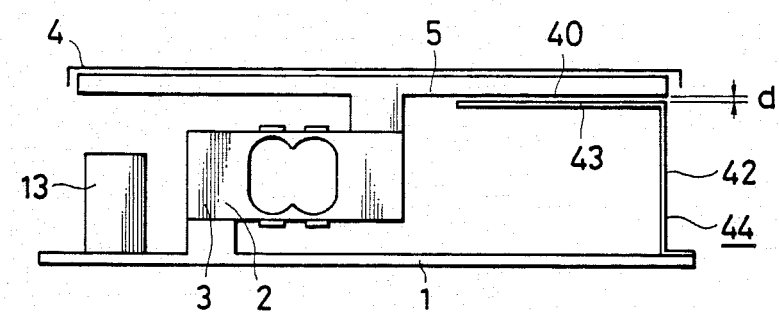
FIG. 12 is a front elevational view of a basic structure of a load cell weighing instrument showing a sixth embodiment of the present invention.

Now, a sixth embodiment of the present invention will be described with reference to FIG. 12. In the embodiment shown, a dc amplifier 13 is located adjacent a fixed portion 3 of a load cell 2 while a metal plate 42 is located adjacent a movable portion 6 of the load cell 2 on a base 1 below a scale plate frame 5. The metal plate 42 has one end secured to the base 1 and is bent so as to extend first in a vertical direction and then in a horizontal direction toward the movable portion 6 of the load cell 2. Thus, the horizontal portion of the metal plate 42 provides an opposing wall 43 which is opposed to the scale plate frame 5 with a gap of a distance d left therebetween. Accordingly, a distributed capacitance forming means 40 is formed by and between the opposing wall 43 of the metal plate 42 and the scale plate frame 5, and a by-pass route 44 is formed by the distributed capacitance forming means 40 and the metal plate 42. While this applies similarly to the other preceding embodiments described above, even if the dc amplifier 13 is arranged in such a manner that it is covered by the scale plate frame 5, a high frequency component is not transmitted to the dc amplifier 13 via a route including strain gauges 9 nor via another route not including the strain gauges 9 because it will flow through the by-pass route 44 to the base 1. Or even if a high frequency component should be transmitted to the dc amplifier 13, its level is very low. Accordingly, a possible influence of a high frequency component on the dc amplifier 13 can be eliminated assuredly.

Figure 13:
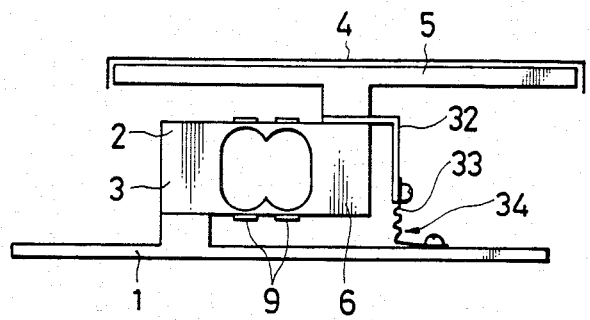
FIG. 13 is a front elevational view of a basic structure of a load cell weighing instrument showing a seventh embodiment of the present invention.

A seventh embodiment of the present invention is illustrated in FIG. 13. In the embodiment shown, a connecting plate 32 secured between a load cell 2 and a scale plate frame 5 is bent so as to extend downwardly, and a piece 33 of very thin metal foil is extended between the connecting plate 32 and a base 1, thereby forming a by-pass route 34. The metal foil piece 33 is retained in a slackened condition so that it may not have an influence on movement of the load cell 2. With the construction described above, not only a high frequency component but all the other components of electric current flow induced in the scale plate frame 5 by electromagnetic waves can be introduced to the base 1.

Figure 14:
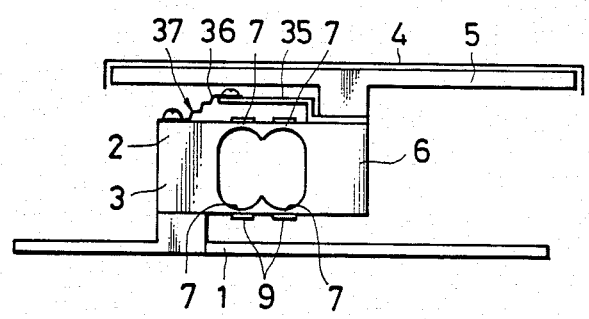
FIG. 14 is a front elevational view of a basic structure of a load cell weighing instrument showing a eighth embodiment of the present invention.

FIG. 14 illustrates an eighth embodiment of the present invention wherein a piece 36 of very thin metal foil is extended in a slackened condition between a connecting plate 35 secured between a load cell 2 and a scale plate frame 5 and a fixed portion 3 of the load cell 2 in such a manner that it may not have an influence on movement of the load cell 2, thereby forming a by-pass route 37. The connecting plate 35 is shaped so as to extend in a suitably spaced relationship around distortion yielding portions 7 of the load cell 2.

Figure 15:
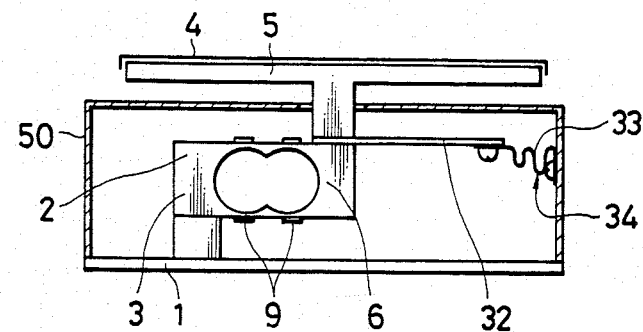
FIG. 15 is a front elevational view of a load cell weighing instrument showing a ninth embodiment of the present invention.
Figure 16:
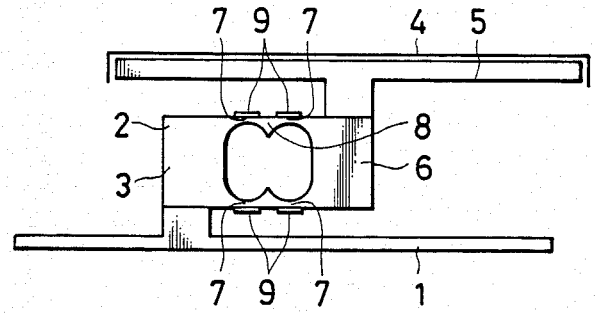
FIG. 16 is a front elevational view showing a basic structure of an exemplary one of conventional load cell weighing instruments.
Figure 17:
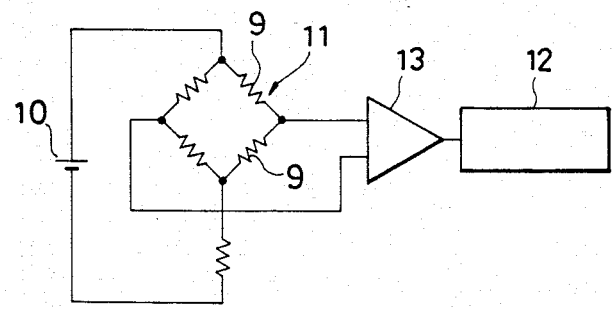
FIG. 17 is a circuit diagram of an electric circuit of the load cell weighing instrument of FIG. 16.
Figure 18:
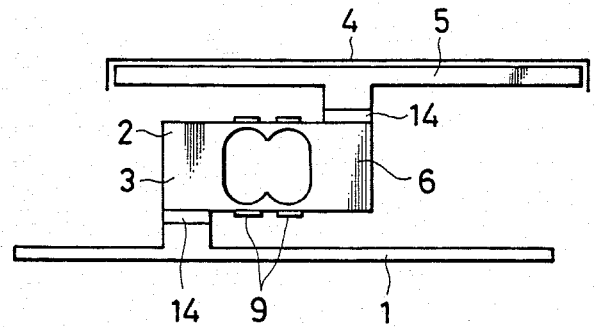
FIG. 18 is a front elevational view showing an exemplary one of conventional load cell weighing instruments.
Figure 19:
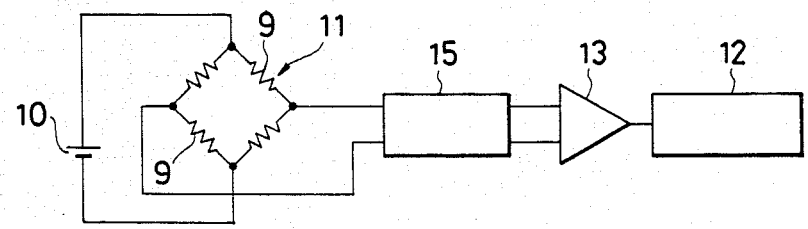
FIG. 19 is a circuit diagram showing another exemplary one of conventional load cell weighing instruments.

A ninth embodiment of the present invention will now be described with reference to FIG. 15. The present embodiment has a basically similar construction to the seventh embodiment described above, and accordingly like parts are denoted by like reference numerals and description thereof is omitted herein. In the present embodiment, a connecting plate 32 secured between a load cell 2 and a scale plate frame 5 is extended in a horizontal direction without being bent, and a piece 33 of metal foil is connected between an end portion of the connecting plate 32 and an inside wall 50a of a body case 50.

It is to be noted that, in reducing the present invention to practice, it may be applied not only to a load cell weighing instrument but also to some other electronic appliance such as an optical disk player. Where the present invention is applied to an optical disk player, an information media serves as a conductor member, and an optical head for optically reading information written on such an information media and for converting it into an electric signal serves as a sensor means.

What is claimed is:

1. An electronic appliance, comprising:
a conductor member located in a spaced relationship by a predetermined distance from a base which constitutes a body case together with a housing mounted on said base;
a sensor means located near said conductor member;
a by-pass route for by-passing said sensor means to introduce a high frequency component of electric current flow induced in said conductor member by electromagnetic waves to said body case; and
a distributed capacitance forming means interposed in said by-pass route.

2. An electronic appliance according to claim 1, wherein an amplifier for amplifying an output signal of said sensor means is located such that it may be covered by said scale plate frame.

3. An electronic appliance according to claim 1 wherein said by-pass route is formed by a metal plate having one end secured to said movable portion of said load cell and having an opposing wall formed in an opposing spaced relationship by a predetermined distance from said base at the other end thereof which extends downwardly along said movable portion of said load cell, said distributed capacitance forming means being formed by and between said opposing wall of said metal plate and said base.

4. An electronic appliance according to claim 3, wherein said metal plate is held between said load cell and said scale plate frame so as to secure said metal plate to an upper face of said load cell.

5. An electronic appliance according to claim 3, wherein said metal plate is secured to a lower face of said load cell.

6. An electronic appliance according to claim 1, wherein said by-pass route is formed by a metal plate having one end secured to said movable portion of said load cell and having an opposing wall formed in an opposing spaced relationship by a predetermined distance from an inside wall of said housing at the other end thereof which extends in a horizontal direction from said movable portion of said load cell, said distributed capacitance forming means being formed by and between said opposing wall of said metal plate and said housing.

7. An electronic applicance according to claim 6, wherein said metal plate is held between said load cell and said scale plate frame so as to secure said metal plate to an upper face of said load cell.

8. An electronic appliance according to claim 6, wherein said metal plate is secured to a lower face of said load cell.

9. An electronic appliance according to claim 1, wherein said by-pass route is formed by a metal plate having one end secured to one of said fixed and movable portions of said load cell and having an opposing wall formed at the other end thereof and opposed in a spaced relationship by a predetermined distance to the other of said fixed and movable portions of said load cell, said distributed capacitance forming means being formed by opposing portions of said metal plate and the other of said fixed and movable portions of said load cell, said metal plate being shaped so as not to interfere with said distortion yielding portion of said load cell.

10. An electronic appliance according to claim 9, wherein a fixed portion of said metal plate is held between said movable portion of said load cell and said scale plate frame so as to secure said metal plate to an upper face of said load cell.

11. An electronic appliance according to claim 1, wherein said by-pass route is formed by a metal plate secured to said base and opposed in a spaced relationship by a predetermined distance to said movable portion of said load cell, said distributed capacitance forming means being formed by opposing portions of said metal plate and said movable portion of said load cell.

12. An electronic appliance according to claim 11, wherein said metal plate is so shaped that it may oppose to three vertical faces of said movable portion of said load cell.

13. An electronic appliance according to claim 1, wherein said distributed capacitance forming means is formed by a through type capacitor.

14. An electronic appliance according to claim 13, wherein said through type capacitor is mounted at an end of a metal plate which is secured at the other end thereof to said movable portion of said load cell and extends downwardly along said movable portion, and said through type capacitor is loosely fitted for movement along a metal bar which is erected uprightly on said base.

15. An electronic appliance according to claim 14, wherein said metal plate is held between said movable portion of said load cell and said scale plate frame so as to secure said metal plate to an upper face of said load cell.

16. An electronic appliance according to claim 13, wherein said through type capacitor is mounted at an end of a metal plate which is secured at the other end thereof to one of said fixed and movable portions of said load cell and extends toward the other of said fixed and movable portions of said load cell in such a profile that said metal plate may not interfere with said distortion yielding portion of said load cell, and said through type capacitor is loosely fitted for movement along a metal bar which is erected uprightly on an upper face of said load cell.

17. An electronic appliance according to claim 16, wherein said metal plate is held between said movable portion of said load cell and said scale plate frame so as to secure said metal plate to an upper face of said load cell.

18. An electronic appliance according to claim 1, wherein said by-pass route is formed by a metal plate secured to said base and opposed in a spaced relationship by a predetermined distance to said scale plate frame, said distributed capacitance forming means being formed by and between opposing portions of said metal plate and said scale plate frame.

19. An electronic appliance according to claim 18, wherein said distributed capacitance forming means is formed at a location remote from the location of said load cell on said base with respect to said movable portion of said load cell.

20. A load cell weighing instrument, comprising:
a load cell having at one end thereof a fixed portion secured to a base which constitutes a body case together with a housing mounted on said base, said load cell having at the other end thereof a movable portion at which a load is to be applied to said load cell, said load cell further having between said movable portion and said fixed portion thereof a distortion yielding portion at which said load cell is deformed by a load applied to said movable portion thereof, said load cell having a strain gauge located at said distortion yielding portion thereof for delivering a magnitude of deformation of said distortion yielding portion as an electric signal;
a scale plate frame secured to said movable portion of said load cell and having a scale plate placed thereon;
a by-pass route for electrically interconnecting said scale plate frame and said body case to by-pass said distortion yielding portion of said load cell to introduce electric current flow induced in said scale plate frame by electromagnetic waves to said body case; and
a piece of thin metal foil interposed in said by-pass route.

21. A load cell weighing instrument according to claim 20, wherein a metal plate is secured at one end thereof to said movable portion of said load cell and extends downwardly along said movable portion of said load cell with the other end thereof connected to said base via said piece of metal foil.

22. A load cell weighing instrument according to claim 21, wherein said metal plate is held between said movable portion of said load cell and said scale plate frame so as to secure said metal plate to an upper face of said load cell.

23. A load cell weighing instrument according to claim 20, wherein said piece of metal foil connected to said load cell is connected to an end of a metal plate which is secured at the other end thereof to one of said fixed and movable portions of said load cell and extends toward the other of said fixed and movable portions of said load cell in such a profile that said metal plate may not interfere with said distortion yielding portion of said load cell.

24. A load cell weighing instrument according to claim 23, wherein said metal plate is held between said movable portion of said load cell and said scale plate frame so as to secure said metal plate to an upper face of said load cell.

25. A load cell weighing instrument according to claim 20, wherein a metal plate which is secured at one end thereof to said movable portion of said load cell and extends substantially in a horizontal direction from said movable portion of said load cell is connected at the other end thereof to an inside wall of said housing via said piece of metal foil.

26. A load cell weighing instrument according to claim 25, wherein said metal plate is held between said movable portion of said load cell and said scale plate frame so as to secure said metal plate to an upper face of said load cell.

* * * * *